United States Patent [19]

Adams et al.

[11] 4,016,489
[45] Apr. 5, 1977

[54] GROUND-TEST CIRCUIT WITH MINIMAL GROUND CURRENT

[75] Inventors: James S. Adams; Charles W. Cutler, both of Batesville, Ind.

[73] Assignee: Hill-Rom Company, Inc., Batesville, Ind.

[22] Filed: Oct. 4, 1974

[21] Appl. No.: 512,313

[52] U.S. Cl. .................. 324/51; 340/255
[51] Int. Cl.² ........................ G01R 31/02
[58] Field of Search .......... 324/51; 317/18 B; 340/255

[56] References Cited

UNITED STATES PATENTS

| | | | |
|---|---|---|---|
| 2,999,189 | 9/1961 | Gerrard | 317/18 B |
| 3,222,663 | 12/1965 | Dennis | 324/51 X |
| 3,386,002 | 5/1968 | Russell | 340/255 X |
| 3,699,392 | 10/1972 | Lee et al. | 324/51 X |
| 3,716,876 | 2/1973 | Petzon | 5/68 |
| 3,783,340 | 1/1974 | Becker | 324/5 N |
| 3,913,153 | 10/1975 | Adams et al. | 5/68 |

*Primary Examiner*—James B. Mullins

[57] ABSTRACT

Ground-test device indicating when the connection to ground has become lost and passing no more than about 12 microamperes of current into the ground system. The device also develops an indication when the wiring from the source of a.c. power suffers from reversed polarity or when the common, or neutral, connection floats appreciably above ground. When no abnormality exists, the circuit introduces less than about 0.6 microamperes to ground.

13 Claims, 1 Drawing Figure

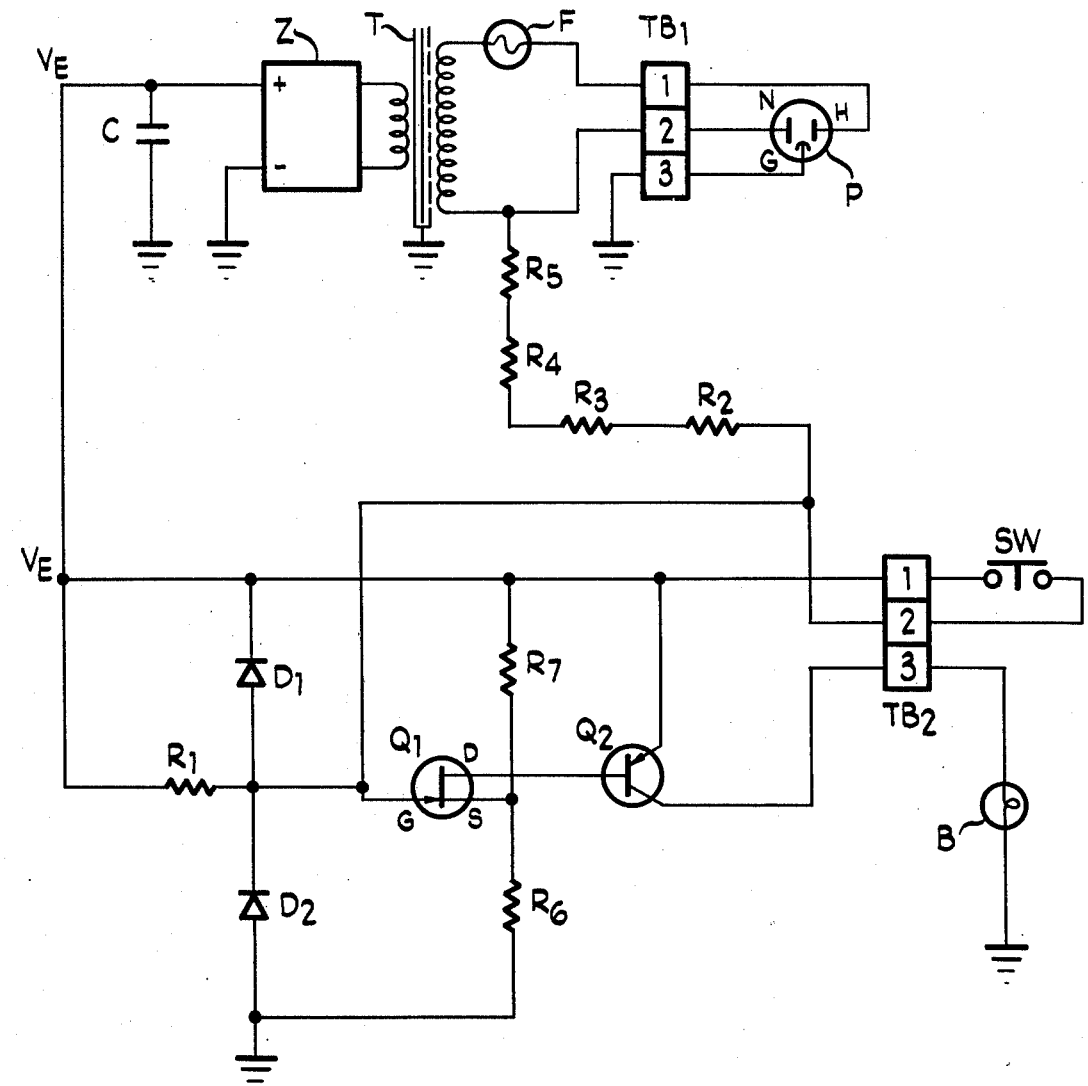

GROUND-TEST CIRCUIT WITH MINIMAL GROUND CURRENT

BACKGROUND

To provide a protection from the possibility of electrical shock, many appliances provide a connection between their exposed metallic portions and electrical ground. Should this connection fail for some reason, its measure of protection no longer remains available.

Most modern hospital beds include at least some electrical facilities, especially one or more motors to alter its configuration. Because of the possibly prolonged and intimate contact of a patient's skin with the bed frame, the connection to ground represents a particularly important safeguard. Accordingly, the safety of the bed increases where it includes an indication that its connection to ground remains intact.

A. P. Petzon et al. U.S. Pat. No. 3,716,876 incorporates, in the circuitry for a bed, a ground-indicating device. However, this simply amounts to a light bulb connected between ground and the side of the transformer receiving the a.c. power.

This device, consequently, suffers from several serious limitations. First, it lacks any ability to indicate when the a.c. voltage source has reversed polarity, with the "hot" wire appearing at the common terminal and vice versa.

Second, the common terminal in an a.c. voltage source should have a potential of ground, or zero volts. The circuit in Petzon et al. gives no alarm should the common line's voltage rise substantially above that.

Last, all current passing through the bulb, which generally remains lit, enters the ground system. The bulb from each bed would pass at least about 1 milliampere. In a hospital having several hundreds of beds, the current in the supposedly safe ground system could well exceed one-quarter of an ampere, an unacceptably high level.

SUMMARY

Ground-test circuits generally include a potential source powering a testing means which detects the presence or, equivalently, the absence of a connection to ground. A responding means couples to the tester and develops a physical response when no connection to ground exists. The physical response may include the activation or quenching of a light source or a sound device or even a mechanism to effect the electrical circuitry itself, such as a relay-activated switch.

However, the circuit should include a control means coupled to the potential source and limiting the current entering the ground systems. To allow the connection of a large number of ground-test devices in a building, the current from each device to ground should remain less than about 12 microamps.

The device may also test for reversed polarity in the a.c. power source and a floating common or "neutral" wire. If none of these anomalies exist, then the controller should limit the current to ground to less than about one microamps.

BRIEF DESCRIPTION OF THE FIGURE

The FIGURE shows a ground-test circuit which introduces minimal current into the ground system.

DETAILED DESCRIPTION

The circuit in the FIGURE, discussed in J. S. Adams et al. U.S. patent application Ser. No. 496,211, derives its power through the usual plug P. The hot terminal H, the neutral N and the ground G of the plug connect to the terminal bar $TB_1$.

After passing through the fuse F, the a.c. potential then appears across the primary winding of the transformer T. The transformer core also connects to ground for safety.

The secondary winding of the transformer T takes the a.c. potential and passes it to the rectifier Z which provides a d.c. output of about 12 volts from the usual 120 V. a.c. line voltage. The capacitor filters the d.c. potential to provide the operating 12 V. power, $V_E$, for the rest of the circuit. This $V_E$ appears with respect to the ground connection, although, due to faulty wiring, the ground connection may not actually connect to the usual earth ground of 0 V.

In its normal operation, the circuit includes a proper connection to earth ground, a correct polarity on the a.c. power source, and a common connected to earth ground. Under these conditions, the circuit ground connects through earth ground to the circuit common at some point. Accordingly, the resistors $R_1$ through $R_5$ constitutes a potential divider between the 12 volts $V_E$ and common which in turn, by above, connects to the other side of the potential source at circuit ground. In particular, with $R_1$ at a value of approximately 10 megohm and $R_2$ through $R_5$ having a combined value of 10.8 Mohm, a potential of approximately 6.2 V. or about half of the applied 12 V. potential of $V_E$ appears between $R_1$ and $R_2$.

This potential of 6.2 V. appears in particular at the gate G of the field-effect transistor $Q_1$. The source S of the FET $Q_1$ has a voltage determined by the potential divider formed from the resistors $R_6$ and $R_7$. With $R_6$ chosen at 4.7 kilohms and $R_7$ at 470 ohms the source S experiences a potential of 10.9 V. Accordingly, the gate G stands more negative than the pinch-off voltage of $Q_1$ of approximately −2 V. with respect to its source S. Thus, the FET $Q_1$ turns off, with the result that no current flows between any of its terminals. This leaves the drain D floating with respect to the gate G and, in particular, with respect to the source S.

The drain D also connects to the base of the P-N-P transistor $Q_2$ and, since it floats with respect to the other two terminals of the transistor $Q_1$, it closely assumes the potential of the emitter of $Q_2$ at 12 V. This potential and the negligible current to the base of $Q_2$ do not suffice to turn on $Q_2$. Consequently, the bulb B has an open connection and cannot light.

The switch SW tests the proper operation of the transistors $Q_1$ and $Q_2$ as well as the bulb B. When depressed, it directly connects the gate G of the FET transistor $Q_1$ to the 12 V. power supply $V_E$. The gate G of $Q_1$ at 12 V. rises above the pinch-off voltage of $Q_1$, turning it on. When this occurs, the potential of the drain D closely approaches the source S and, in any event, becomes sufficiently low to turn on the transistor $Q_2$. With $Q_2$ turned on, current flows from the 12 V. supply $V_E$ through $Q_2$, the bulb B, and to ground causing the bulb B to light. Clearly, if either the transistor $Q_1$, the transistor $Q_2$, or the bulb B did not operate properly, the bulb B would not light upon the depressing of the switch SW. The lighting of the bulb B shows that all three operate properly.

The loss of a connection to earth ground represents one abnormality that can occur to a circuit. In this case, since the connection between the common line and the circuit ground occurs through the earth ground, the circuit ground and the common line would become disconnected. Consequently, the resistors $R_1$ and $R_2$ through $R_5$ do not represent a potential divider since current from $V_E$ through the resistors $R_1$ through $R_5$ to common can no longer pass to the circuit ground at the other side of the potential supply $V_E$. In particular no current flows across $R_1$ with the result that the gate G of the FET $Q_1$ goes to 12 V., turning on that transistor. This in turn, by above, turns on transistor $Q_2$ and the bulb B to indicate a problem.

A further serious abnormality occurs upon the reversal of the wiring between the common line and the 120 V. hot line of the a.c. power source. During the positive half cycle of the a.c. power, the current flows from the 120 V. line through the resistors $R_2$ through $R_5$, across the diode $D_1$ and through the capacitor C and the power supply Z. The diode $D_1$ establishes the potential at the gate of $Q_1$ at nearly 12 V., turning it on. With $Q_1$ turned on, $Q_2$ turns on and so does the bulb B.

During the negative half cycle of the a.c. power, the current flows through the resistors $R_2$ through $R_5$ and across the diode $D_2$ after the negative a.c. voltage forces the junction below —0.6 volts, the turn-on voltage of the diode $D_2$. The gate G of $Q_1$ then goes to —0.6 V. This turn-on voltage of the diode $D_2$ turns off the transistor $Q_1$, the transistor $Q_2$ and the bulb B. Accordingly, the bulb B turns on and off each cycle and, thus, flickers with the cycle frequency of 60 cycles per second, appearing on.

A further problem in the circuit wiring develops when the common connection floats with regards to earth ground. When it floats even as high as 5 V. RMS. with respect to ground, the potential divider of $R_1$ on the one hand and $R_2$ through $R_5$ on the other hand divides the voltage between 12 V. and 5 V. leaving a potential of approximately 8.5 V. on the gate G of the FET transistor $Q_L$. This turns on $Q_1$ and, along with it, the transistor $Q_2$ and the bulb B.

Three abnormalities with regards to the wiring of the a.c. power source include no ground, reverse polarity and floating common. Each of these will turn on the bulb B to give a positive indication of a problem.

The current placed into the ground system during the normal operation of the circuit appears from $V_E$ across the resistors $R_1$ through $R_5$, has a value of 12 V. divided by 20.8 Mohms, and amounts to 0.6 microamps. For reversed polarity, 120 V. RMS. appears across the resistors $R_2$ through $R_5$ and supplies a ground current of 12 microamps either directly at the ground connection of the circuit or to the ground connections of the capacitor C and the power supply Z. With no ground, of course, no current enters the ground system.

The low ground current results from the use of the FET $Q_1$ whose operation depends upon the potential and not the current at its gate G. Accordingly, the high resistances $R_1$ through $R_5$ may supply the required potential while limiting the current from the power supply Z into ground.

In the high-potential test required by Underwriter's laboratories, the common and high-voltage lines tie together and a potential difference of 1240 V. a.c. impressed between them and the ground connection. In this type of connection the 1240 volts appear across the resistors $R_2$ through $R_5$ and results in a current through them of 0.12 milliamps. This low amount of current prevents breakdown during the test.

The following table gives the specific components employed in the circuit.

TABLE: Components used in the FIGURE.

| Component | Identification |
| --- | --- |
| B | 14 V. |
| C | 330 μF., 25 V. |
| $D_1$, $D_2$ | 1N4148 |
| F | 1/16 A., 250 V. |
| $Q_1$ | 2N5484 |
| $Q_2$ | 2N5142 |
| $R_1$ | 10 MΩ |
| $R_2$, $R_3$, $R_4$, $R_5$ | 2.7 MΩ |
| $R_6$ | 4.7 KΩ |
| $R_7$ | 470Ω |
| T | 290-12021 |
| Z | FWB, 1 A., 50 V. |

Accordingly, what is claimed is:

1. A ground-test circuit for an appliance energized by an a.c. power source having the neutral thereof grounded, the chassis of the appliance to be connected to ground, comprising:

a d.c. power supply having a first side thereof connected to the chassis of the appliance, so that a second side thereof provides a d.c. test potential with respect to the chassis;

a voltage divider connected between said second side of said d.c. power supply and the neutral of the a.c. power source, said voltage divider having an intermediate terminal and a total resistance sufficiently great to limit the current flow therethrough to a desired level;

a voltage responsive device connected to said intermediate terminal of said voltage divider, the potential at said intermediate terminal being less than that required to activate said voltage responsive device, when the chassis of the appliance and the neutral of the a.c. power source are properly grounded and when the a.c. power source is connected to the appliance with the proper polarities; and responding means being activated upon activation of said voltage responsive device when the potential at said intermediate terminal of said voltage divider rises due to ungrounding of the chassis of the appliance, the neutral of the a.c. power source floating above ground potential or incorrect wiring of the a.c. power source connections.

2. A circuit as claimed in claim 1 and further comprising switch means to selectively raise the potential at said intermediate terminal of said voltage divider sufficiently to activate said voltage responsive device in order to check the operability of said voltage responsive device and said responding means.

3. A circuit as claimed in claim 1 wherein said voltage responsive device comprises a field effect transistor, the gate of said field effect transistor connected to said intermediate terminal of said voltage divider, the source of said field effect transistor connected to a potential greater than the potential at the gate unless the chassis is ungrounded or the a.c. power source improperly connected, and the drain of said field effect transistor coupled to said responding means.

4. A circuit as claimed in claim 3 and further comprising:

a first diode connected from the gate of said field effect transistor to said d.c. test potential; and a second diode connected from the gate of said field effect transistor to the chassis of the appliance.

5. A circuit as claimed in claim 3 and further comprising a transistor having its emitter-collector circuit in series with said responding means and its base connected to the drain of said field effect transistor.

6. A circuit as claimed in claim 5 wherein said responding means comprises a light bulb.

7. A ground-test circuit for a hospital bed energized by an a.c. power source having the neutral thereof grounded, the frame of the hospital bed to be connected to ground, comprising:

a d.c. power supply having a first side thereof connected to the frame of the hospital bed, so that a second side thereof provides a d.c. test potential with respect to the frame;

a first voltage divider connected from said d.c. test potential to the neutral of the a.c. power source, said first voltage divider having an intermediate terminal and total resistance sufficiently great to limit the current flow therethrough to a desired level;

a field effect transistor having gate, source and drain terminals, said gate being connected to said intermediate terminal of said first voltage divider;

a second voltage divider connected from said d.c. test potential to the frame of the hospital bed and having an intermediate terminal, said source of said field effect transistor connected to said intermediate terminal of said second voltage divider with the potential at said intermediate terminal of said second voltage divider being greater than the potential at said intermediate terminal of said first voltage divider so long as the frame of the hospital bed is properly grounded and the a.c. power source is connected with the proper polarities; and responding means actuated from said drain of said field effect transistor if the frame of the hospital bed is not properly grounded or the a.c. power source is not properly connected.

8. A circuit as claimed in claim 7 wherein:

the potential at said intermediate terminal of said second voltage divider is about ninety per cent of said d.c. test potential; and the potential at said intermediate terminal of said first voltage divider is about one half said d.c. test potential, so long as the frame of the hospital bed is properly grounded and the a.c. power source is properly connected.

9. A circuit as claimed in claim 7 and further comprising:

a first diode, the anode of said first diode connected to the gate of said field effect transistor and the cathode of said first diode connected to said d.c. test potential; and a second diode, the anode of said second diode connected to the frame of the hospital bed and the cathode of said second diode connected to the gate of said field effect transistor.

10. A circuit as claimed in claim 7 and further comprising a manually actuable switch connected between said d.c. test potential and the gate of said field effect transistor, said switch being selectively operable to activate said field effect transistor to in order to check the operability of said field effect transistor and said responding means.

11. A circuit as claimed in claim 7 wherein said responding means is a light bulb and further comprising a transistor having its emitter connected to said d.c. test potential and its collector connected to said light bulb, the base of said transistor connected to the drain of said field effect transistor.

12. A circuit as claimed in claim 7 wherein said d.c. power supply comprises:

a transformer having a primary winding and a secondary winding, said primary winding connected to the a.c. power source;

a rectifier, said secondary winding connected to said rectifier to produce a d.c. test potential between an output terminal thereof and the frame of the hospital bed; and a filter capacitor connected from said output terminal to the frame of the hospital bed.

13. A ground-test circuit for a hospital bed energized by an a.c. power source having the neutral thereof grounded, the frame of the hospital bed to be connected to ground, comprising:

a transformer, the primary winding of said transformer being connected to the a.c. power source;

a rectifier, the secondary winding of said transformer being connected to said rectifier to produce a d.c. test potential of about twelve volts between an output terminal of said rectifier and the frame of the hospital bed;

a filter capacitor connected from said output terminal of said rectifier to the frame of the hospital bed;

a first voltage divider comprising a plurality of resistors connected in series from said d.c. test potential to the neutral of the a.c. power source, said first voltage divider having an intermediate terminal with a potential of approximately one half of said d.c. test potential thereon, the total resistance of said first voltage divider being sufficiently great to limit the current therethrough to about twelve microamperes;

a first diode having its anode connected to said intermediate terminal of said first voltage divider and its cathode connected to said d.c. test potential;

a second diode having its anode connected to the frame of the hospital bed and its cathode connected to said intermediate terminal of said first voltage divider;

a field effect transistor having a gate, a source and a drain, the gate of said field effect transistor connected to said intermediate terminal of said first voltage divider;

a second voltage divider connected from said d.c. test potential to the frame of the hospital bed, an intermediate terminal of said second voltage divider connected to the source of said field effect terminal, said intermediate terminal of said second voltage divider being at a potential about ninety per cent of said test potential;

a transistor having an emitter, a collector and a base, the emitter of said transistor connected to said d.c. test potential and the base of said transistor connected to the drain of said field effect transistor;

a light bulb connected between the collector of said transistor and the frame of the hospital bed; and a manually actuable switch connected to selectively apply said d.c. test potential to the gate of said field effect transistor.

* * * * *